(12) United States Patent
Mazoyer et al.

(10) Patent No.: US 10,792,894 B2
(45) Date of Patent: Oct. 6, 2020

(54) SEASONAL SOLAR CONTROL COMPOSITE

(71) Applicant: SAINT-GOBAIN PERFORMANCE PLASTICS CORPORATION, Solon, OH (US)

(72) Inventors: Simon Mazoyer, Paris (FR); Fabien Lienhart, San Diego, CA (US)

(73) Assignee: SAINT-GOBAIN PERFORMANCE PLASTICS CORPORATION, Solon, OH (US)

( * ) Notice: Subject to any disclaimer, the term of this patent is extended or adjusted under 35 U.S.C. 154(b) by 91 days.

(21) Appl. No.: 15/766,573

(22) PCT Filed: Oct. 13, 2016

(86) PCT No.: PCT/US2016/056745
§ 371 (c)(1),
(2) Date: Apr. 6, 2018

(87) PCT Pub. No.: WO2017/066385
PCT Pub. Date: Apr. 20, 2017

(65) Prior Publication Data
US 2018/0297328 A1    Oct. 18, 2018

Related U.S. Application Data

(60) Provisional application No. 62/242,162, filed on Oct. 15, 2015.

(51) Int. Cl.
*B32B 15/08* (2006.01)
*B32B 27/36* (2006.01)
(Continued)

(52) U.S. Cl.
CPC ............... *B32B 15/08* (2013.01); *B32B 3/30* (2013.01); *B32B 7/02* (2013.01); *B32B 27/08* (2013.01);
(Continued)

(58) Field of Classification Search
CPC ....... B32B 15/08; B32B 27/08; B32B 27/365; B32B 27/36; B32B 3/30; B32B 7/02;
(Continued)

(56) References Cited

U.S. PATENT DOCUMENTS 4,264,664 A    4/1981  Kunz
4,411,493 A    10/1983 Miller
(Continued)

FOREIGN PATENT DOCUMENTS

CN    101680982 A    3/2010
CN    103338927 A    10/2013
(Continued)

OTHER PUBLICATIONS

International Search Report and Written Opinion for PCT/US2016/056745, dated Jan. 24, 2017, 12 pages.
(Continued)

*Primary Examiner* — Ruiyun Zhang
(74) *Attorney, Agent, or Firm* — Abel Schillinger, LLP; Chi Suk Kim (57) ABSTRACT

A solar control composite has improved seasonal selectivity, allowing a greater amount of heat to be transmitted through the composite during the winter and a lower amount of heat transmitted through the composite during the summer.

20 Claims, 2 Drawing Sheets

(51) Int. Cl.
  *B32B 7/02* (2019.01)
  *B32B 3/30* (2006.01)
  *B32B 27/08* (2006.01)
  *H01L 51/44* (2006.01)

(52) U.S. Cl.
  CPC ............ *B32B 27/36* (2013.01); *B32B 27/365* (2013.01); *H01L 51/448* (2013.01); *B32B 2255/10* (2013.01); *B32B 2255/20* (2013.01); *B32B 2255/205* (2013.01); *B32B 2307/40* (2013.01); *B32B 2307/412* (2013.01); *B32B 2307/418* (2013.01); *B32B 2419/00* (2013.01); *B32B 2551/00* (2013.01); *B32B 2605/00* (2013.01); *Y10T 428/1059* (2015.01)

(58) Field of Classification Search
  CPC ......... B32B 2551/00; B32B 2307/412; B32B 2304/418; B32B 2307/40; H01L 51/448; Y10T 428/1059
  USPC ........... 428/1.5; 264/2.7; 359/634, 601, 613, 359/599, 350
  See application file for complete search history.

(56) References Cited

U.S. PATENT DOCUMENTS

| | | |
|---|---|---|
| 4,498,455 A | 2/1985 | Gramm |
| 5,418,039 A | 5/1995 | Carter |
| 6,123,986 A | 9/2000 | Maschwitz et al. |
| 6,311,437 B1 | 11/2001 | Lorenz |
| 6,860,081 B2 | 3/2005 | Walton et al. |
| 7,057,805 B2 | 6/2006 | Phillips et al. |
| 7,157,133 B2 | 1/2007 | Moran |
| 7,491,440 B2 | 2/2009 | Fukatani et al. |
| 7,759,414 B2 | 7/2010 | Hayes et al. |
| 7,771,831 B2 | 8/2010 | Kodaira et al. |
| 8,303,122 B2 | 11/2012 | Hughes |
| 2003/0039842 A1 | 2/2003 | Nakashima et al. |
| 2003/0076582 A1 | 4/2003 | Phillips et al. |
| 2005/0068630 A1 | 3/2005 | Nitz et al. |
| 2005/0164014 A1 | 7/2005 | Tomonaga et al. |
| 2006/0110593 A1 | 5/2006 | Fukatani et al. |
| 2006/0269739 A1 | 11/2006 | Phillips et al. |
| 2007/0048519 A1 | 3/2007 | Anderson et al. |
| 2008/0020232 A1 | 1/2008 | Winckler et al. |
| 2008/0090073 A1 | 4/2008 | Tomonaga et al. |
| 2008/0210303 A1 | 9/2008 | Lu et al. |
| 2008/0292820 A1 | 11/2008 | Padiyath et al. |
| 2008/0308677 A1 | 12/2008 | Kirchoff et al. |
| 2010/0177380 A1 | 7/2010 | Nagahama et al. |
| 2010/0195197 A1 | 8/2010 | Usami |
| 2010/0258185 A1 | 10/2010 | Meyer et al. |
| 2011/0135880 A1 | 6/2011 | Roman et al. |
| 2011/0188125 A1 | 8/2011 | Takenaka et al. |
| 2011/0226937 A1 | 9/2011 | Yu et al. |
| 2011/0287229 A1 | 11/2011 | Sakamoto et al. |
| 2012/0026580 A1 | 2/2012 | Kiyoto |
| 2012/0055551 A1 | 3/2012 | Rodriquez-Parada et al. |
| 2012/0064353 A1 | 3/2012 | Kawaguchi et al. |
| 2012/0076986 A1 | 3/2012 | Inuduka et al. |
| 2012/0145306 A1 | 6/2012 | Dehaupas et al. |
| 2012/0154921 A1 | 6/2012 | Yoshida et al. |
| 2012/0227782 A1 | 9/2012 | Tsai et al. |
| 2012/0276323 A1 | 11/2012 | Mori et al. |
| 2012/0285522 A1 | 11/2012 | Sommer et al. |
| 2012/0300306 A1 | 11/2012 | Nagahama et al. |
| 2013/0000718 A1 | 1/2013 | Tsao |
| 2013/0015180 A1 | 1/2013 | Godard et al. |
| 2013/0105069 A1 | 5/2013 | Van Nutt et al. |
| 2014/0007928 A1 | 1/2014 | Yu et al. |
| 2014/0104690 A1 | 4/2014 | Sandre-Chardonnal |
| 2015/0004369 A1 | 1/2015 | Eby et al. |
| 2015/0017747 A1 | 1/2015 | Lam et al. |
| 2015/0192707 A1 | 7/2015 | Ehrensperger et al. |
| 2015/0210586 A1 | 7/2015 | Ehrensperger et al. |
| 2015/0234104 A1 | 8/2015 | Lienhart |

FOREIGN PATENT DOCUMENTS

| | | |
|---|---|---|
| DE | 10103020 A1 | 7/2002 |
| EP | 1072752 A1 | 1/2001 |
| EP | 1524247 A1 | 4/2005 |
| EP | 1419999 B1 | 8/2008 |
| EP | 2128106 A1 | 12/2009 |
| EP | 2416370 A1 | 2/2010 |
| EP | 2219053 A1 | 8/2010 |
| EP | 2541559 A1 | 6/2012 |
| EP | 2535180 A1 | 12/2012 |
| JP | H11330773 A | 11/1999 |
| JP | 2004058592 A | 2/2004 |
| JP | 2005104793 A | 4/2005 |
| JP | 2005157011 A | 6/2005 |
| JP | 2007331296 A | 12/2007 |
| JP | 2008002087 A | 1/2008 |
| JP | 2008037668 A | 2/2008 |
| JP | 2008037671 A | 2/2008 |
| JP | 2010068154 A | 3/2010 |
| JP | 2010202497 A | 9/2010 |
| JP | 2011002819 A | 1/2011 |
| JP | 2011058349 A | 3/2011 |
| JP | 4708302 B2 | 6/2011 |
| JP | 2011128512 A | 6/2011 |
| JP | 2011175249 A | 9/2011 |
| JP | 2011180562 A | 9/2011 |
| JP | 2011185953 A | 9/2011 |
| JP | 2012114041 A | 6/2012 |
| JP | 2012194442 A | 10/2012 |
| JP | 2012256632 A | 12/2012 |
| JP | 2013006713 A | 1/2013 |
| KR | 20110115523 A | 10/2011 |
| TW | 201238066 A | 9/2012 |
| TW | 201240120 A | 10/2012 |
| TW | 201248688 A | 12/2012 |
| TW | 201301542 A | 1/2013 |
| TW | 201405847 A | 2/2014 |
| TW | 201533757 A | 9/2015 |
| WO | 2001023173 A1 | 4/2001 |
| WO | 2002041041 A2 | 5/2002 |
| WO | 2003036758 A1 | 5/2003 |
| WO | 2003068500 A1 | 8/2003 |
| WO | 2008024612 A1 | 2/2008 |
| WO | 2008144217 A1 | 11/2008 |
| WO | 2010067640 A1 | 6/2010 |
| WO | 2010119797 A1 | 10/2010 |
| WO | 2011096150 A1 | 8/2011 |
| WO | 2011096595 A1 | 8/2011 |
| WO | 2011158721 A1 | 12/2011 |
| WO | 2012104547 A1 | 8/2012 |
| WO | 2012121719 A1 | 9/2012 |
| WO | 2012147052 A1 | 11/2012 |
| WO | 2012157655 A1 | 11/2012 |
| WO | 2012161747 A1 | 11/2012 |
| WO | 2013175129 A1 | 11/2013 |
| WO | 2013175130 A1 | 11/2013 |
| WO | 2014009663 A1 | 1/2014 |
| WO | 2014009667 A1 | 1/2014 |
| WO | 2014011662 A1 | 7/2014 |
| WO | 2015123637 A1 | 8/2015 |
| WO | 2017066385 A1 | 4/2017 |

OTHER PUBLICATIONS

Extended European Search Report for EP Application No. 15749231.5, dated Oct. 6, 2017, 6 pages.
International Search Report and Written Opinion for PCT/US2015/016050, dated May 28, 2015, 13 pages.
Widenberg, Björn et al., "Design of Energy Saving Windows with High Transmission at 900 MHz and 1800 MHz," Department of Electroscience Electromagnetic Theory, Lund Institute of Technology, Sweden, Aug. 28, 2002, 16 pages.

SEASONAL SOLAR CONTROL COMPOSITE

CROSS-REFERENCE TO RELATED APPLICATION(S)

This application is a National Stage entry under 35 U.S.C. § 371 of International Application PCT/US2016/056745, filed Oct. 13, 2016, entitled "SEASONAL SOLAR CONTROL COMPOSITE", by Simon MAZOYER et al., which claims priority to U.S. Provisional Patent Application No. 62/242,162, filed Oct. 15, 2015, entitled "SEASONAL SOLAR CONTROL COMPOSITE", by Simon MAZOYER et al., which all applications are assigned to the current assignee hereof and incorporated herein by reference in their entireties.

FIELD OF THE DISCLOSURE

The present disclosure is directed to transparent composites including a solar control layer and methods of forming the same.

BACKGROUND

Solar control layers have been used on windows to reduce the transmission of heat, such as near infrared radiation having wavelengths in a range of 800 nm to 2500 nm, while allowing sufficient transmission of visible light, such as radiation having wavelengths in a range of 400 nm to 700 nm. Existing products, however, provide the same solar control during warmer months as they do during colder months. Attempts have been made to increase heat transmission during colder months (e.g., winter) and decrease heat transmission during warmer months (e.g., summer). Such attempts to achieve seasonal selectivity have not produced acceptable results while complicating fabrication schemes and/or significantly deteriorating optical properties. There exists a need for improved solar control layers that provide sufficient seasonal selectivity without these drawbacks.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE PREFERRED EMBODIMENT(S)

The following description in combination with the figures is provided to assist in understanding the teachings disclosed herein. The following discussion will focus on specific implementations and embodiments of the teaching. This focus is provided to assist in describing the teachings and should not be interpreted as a limitation on the scope or applicability of the teachings.

As used herein, the term "visible light transmittance" or "VLT" refers to the ratio of total visible light that is transmitted through a window film/glass system.

The term "visible light reflectance" or "VLR" refers to the total visible light that is reflected by a window film/glass system.

The term "total solar energy rejected" or "TSER" refers to the total solar energy (heat) rejected by a window film/glass system.

The VLT, VLR, and TSER are calculated according to the ASTM standard (see e.g., NFRC-100, NFRC-200 and NFRC-300).

The terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the solar control arts.

The present disclosure is generally directed to solar control composites having improved seasonal selectivities, and methods for producing the same. For example, Applicants have developed constructs and methods to produce the constructs that are able to more sharply adapt solar control performance in response to changes in incidence angles from the sun as the weather seasons change. For example, a composite according to an embodiment of the present disclosure can allow a greater amount of heat to be transmitted through the composite during a colder season, e.g. the winter, and a lower amount of heat transmitted through the composite during a warmer season, e.g. the summer.

Exemplary embodiments are described below that illustrate and do not limit the scope of the appended claims.

Figures 1, 2, 3:
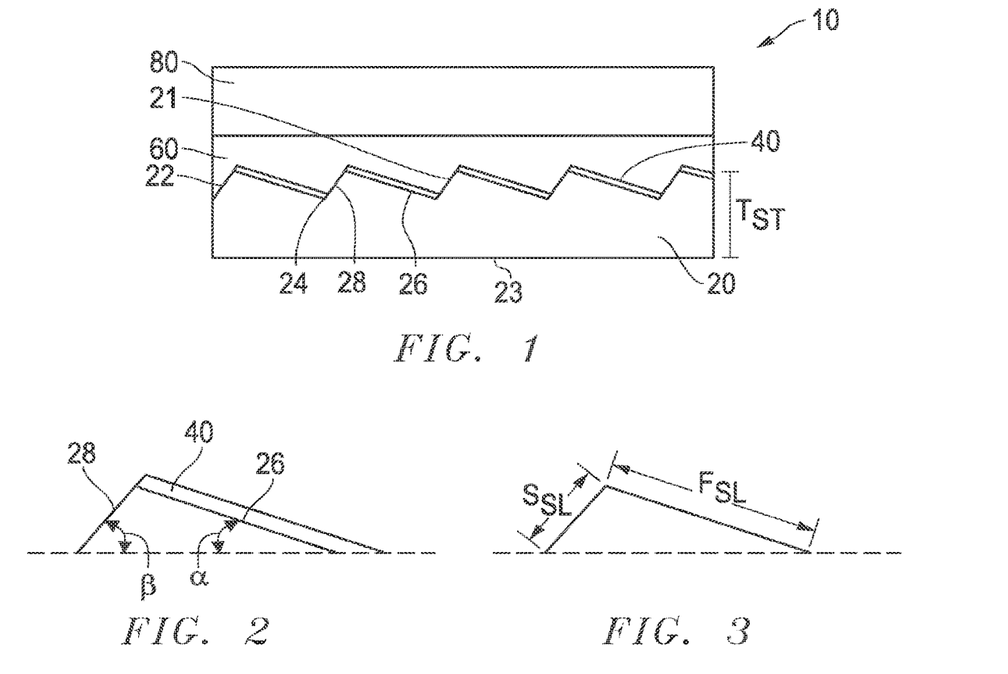
FIG. 1 is an illustration of a cross-section of a composite according to an embodiment of the present disclosure.
FIG. 2 includes an illustration of a single unit of a repeating cross-sectional pattern forming a textured surface on a textured substrate and a solar control layer on the textured surface, according to an embodiment of the present disclosure.
FIG. 3 includes an illustration of a single unit of a repeating cross-sectional pattern forming a textured surface on a textured substrate without a solar control layer on the textured surface, according to an embodiment of the present disclosure.

FIG. 1 includes an illustration of a cross-sectional view of a portion of a solar control composite 10 according to an embodiment of the present disclosure. The solar control composite 10 can include a textured substrate 20, a discontinuous solar control layer 40, a planarization layer 60, and a second substrate layer 80. The textured substrate 20 can include a first major surface 21 having a repeating pattern of peaks 22 and valleys 24 defined by a first sidewall 26 and a second sidewall 28. Furthermore, as illustrated in FIG. 1, the solar control layer 40 can be discontinuously disposed on the first sidewall 26. The textured substrate can include an opposite second major surface 23. In certain embodiments, the opposite second major surface can be a substantially planar or flat surface.

As illustrated in FIG. 1, the first sidewall 26 can slope toward the second major surface 23 from the peak 22 to the valley 24. Further, the second sidewall 28 can slope away from the second major surface from the valley 24 to the peak 22. For example, a view looking atop the first major surface 21 of the textured substrate, the repeating pattern can appear as stripes, such as uniform pattern of stripes disposed along the composite.

The textured substrate 20 can have a thickness, $TS_T$, measured as the average distance from the second major surface 23 to the peak 22 of the first major surface. The textured substrate 20 can have a wide variety of thicknesses depending on the materials used. In certain embodiments, the thickness $TS_T$ of the textured substrate 20 may be no greater than 100 microns, no greater than 75 microns, no greater than 50 microns, no greater than 20 microns, no greater than 9 microns, or even no greater than 7 microns. In further embodiments, the thickness $TS_T$ of the textured substrate can be at least 110 nm, at least 200 nm, at least 500 nm, or at least 1.1 microns. Moreover, the textured substrate 20 can have a thickness $TS_T$ in a range of any of the maximum and minimum values described above, such as, in a range of 110 nm to 20 microns, 500 nm to 9 microns, or 1.1 microns to 7 microns. In other embodiments, the textured substrate 20 can have a thickness $TS_T$ of up to 2 mm, up to 4 mm, or even up to 6 mm. In further embodiments, the thickness $TS_T$ of the textured substrate can be at least 100 microns, at least 200 microns, at least 300 microns, or even at least 400 microns. Moreover, the textured substrate 20 can have a thickness $TS_T$ in a range of any of the maximum and minimum values described above, such as, in a range of 100 microns to 2 mm, 200 microns to 4 mm, or 300 microns to 6 mm.

The textured substrate 20 can include an organic or inorganic material. In certain embodiments, the textured substrate 20 can include a substantially transparent polymer, such as, for example a polyacrylate, a polyester, a polycarbonate, a polysiloxane, a polyether, a polyvinyl compound, another suitable class of transparent polymer, or combinations thereof.

In particular embodiments, the transparent polymer includes a polyacrylate. The polyacrylate, can be a poly (methylacrylate), a poly(ethylacrylate), a poly(propylacrylate), a poly(vinylacrylate), a poly(methyl methacrylate), a polyethyl methacrylate), a poly(propyl methacrylate), a poly (vinyl methacrylate), or a mixture thereof. The polyacrylate can be a copolymer of two, three, or more acrylic precursors. The acrylic precursors can include methyl acrylate, ethyl acrylate, propyl acrylate, vinyl acrylate, methyl methacrylate, ethyl methacrylate, propyl methacrylate, vinyl methacrylate. For example a copolymeric polyacrylate can include poly(methyl methacrylate vinyl methacrylate). In more particular embodiments, the transparent polymer comprises poly(methyl methacrylate). In other more particular embodiments, the transparent polymer consists essentially of poly(methyl methacrylate). In further embodiments, the transparent polymer comprises poly(vinyl methacrylate). In further particular embodiments, the transparent polymer consists essentially of poly(vinyl methacrylate).

In particular embodiments, the transparent polymer includes a polyester. The polyester can include a polyethylene terephthalate (PET), a polyethylene napthalate, a polybutylene terephthalate, a polyethylene isonaphthalate, or any combination thereof. In more particular embodiment, the transparent polymer comprises PET. In further particular embodiments, the transparent polymer consists essentially of PET.

In certain embodiments, the transparent polymer includes a polyether. The polyether can be polyethylene ether, poly propylene ether, polybutylene ether, or any combination thereof. In further embodiments, the polyether can be a copolymer of two, three, or more polyols. For example, the polyether can be a copolymer of 1,2-ethanediol, 1,2-propanediol, 1,3-propanediol, 1,2-butanediol, 1,3-butanediol, 1,4-butanediol.

In certain embodiments, the transparent polymer can be a polyvinyl compound. The polyvinyl compound can be a polyvinyl alcohol, a polyvinyl ester, a polyvinyl acetal, or any combination thereof. In particular embodiments, the polyvinyl acetal can include polyvinyl butyral. In further particular embodiments, the transparent polymer consists essentially of polyvinyl butyral. In further particular embodiments, the polyvinyl compound can be a copolymer of a vinyl alcohol derivative and a olefin. The vinyl alcohol derivative can be vinyl acetate. In certain embodiments, the polyvinyl compound can be poly(ethylene vinyl acetate).

In certain embodiments in which haze is a concern, the textured substrate 20 does not include a polyolefin, such as polyethylene, due at least in part to the crystalline and amorphous phases having significantly different refractive indices causing a high level of haze. In an embodiment, the textured substrate 20 can include nanoparticles such as silica, $TiO_2$, ITO, $SnO_2$ doped with Sb. The nanoparticles are aimed at increasing (in the case of ITO, $SnO_2$ doped with Sb), $TiO_2$) or decreasing (in the case of silica) the refractive index of the textured substrate 20. In another embodiment, the textured substrate 20 can include a glass, a sapphire, a spinel, or an aluminum oxynitride ("AlON").

In certain embodiments, the textured substrate 20 can have a refractive index of at least about 1.4, at least about 1.5, at least about 1.6, or even at least about 1.65. In further embodiments, the textured substrate 20 can have a refractive index of no greater than about 2.0, no greater than about 1.9, no greater than about 1.8, or even no greater than about 1.75. Moreover, the textured substrate 20 can have a refractive index in a range of any of the minimums and maximums provided above, such as in a range of from about 1.4 to about 2.0, about 1.5 to about 1.8, or even about 1.65 to about 1.75.

In particular embodiments, haze can be reduced when the refractive indices of the textured substrate 20 and the planarization layer 60 are approaching each other or are the same. For example, in particular embodiments, the textured substrate 20 can have a refractive index within about 0.1, within about 0.05, or even within about 0.03 units of the refractive index of the planarization layer.

In certain embodiments, the transparent polymer can be selected based on its refractive index. For example, the transparent polymer can have a refractive index that is equal or within 0.03 units from an adjacent layer, such as the planarization layer 60. For example, if an adjacent layer is a glass having a refractive index between 1.47 and 1.55, the transparent polymer can be made of a material that is within 0.03 units of the refractive index of the glass. In one embodiment, an adjacent layer can have a refractive index of 1.49 and the transparent polymer can be of a material having a refractive index of about 1.49. For example, the transparent polymer can be poly(methyl methacrylate) with a refractive index of 1.49. In other embodiments, an adjacent layer can have a refractive index of 1.55 and the transparent polymer can be of a material having a refractive index of about 1.57. For example, the transparent polymer can be polyethylene terephthalate) with a refractive index of 1.57. In more particular embodiments, the textured substrate 20 includes a polyalkylmethacrylate, wherein the alkyl group has 1 to 3 carbon atoms.

FIGS. 2 and 3 include illustrations of a single unit of a repeating cross-sectional pattern forming the textured surface 21 of the textured substrate 20. FIG. 2 includes the solar control layer 40, whereas FIG. 3 includes only the textured substrate. As illustrated in FIG. 2, the first sidewall 26 can have a slope angle noted by alpha ($\alpha$). The reference plane to which the slope angle ($\alpha$) is measured is parallel to the generally planar opposing major surface 23 of the textured substrate 20. Further, the second sidewall 28 has a slope angle noted by beta ($\beta$). The particular slope angles can be selected to enhance the seasonal selectivity of the composite and allow preferential deposition of the solar control layer on the first sidewall, while substantially minimizing solar control material deposited on the second sidewall.

In certain embodiments, the first sidewall 26 can have a slope angle ($\alpha$) of at least about 20 degrees, at least 22 degree, at least 24 degrees, at least 26 degrees, at least 28 degrees, or even 30 degrees. In further embodiments, the first sidewall 26 can have a slope angle ($\alpha$) of no greater than about 45 degrees, no greater than about 43 degrees, no greater than about 41 degrees, no greater than about 39 degrees, no greater than about 37 degrees, or even no greater than about 35 degrees. Moreover, the first sidewall 26 can have a slope angle ($\alpha$) in a range of any of the minimum and maximum values provided above, such as in a range of about 20 degrees to about 45 degrees, or even from about 30 degrees to about 35 degrees.

In particular embodiments, the second sidewall 28 can have a slope angle ($\beta$) of at least about 45 degrees, at least about 47 degrees, at least about 49 degrees, at least about 51 degrees, at least about 53 degrees, or even at least about 55 degrees. In further embodiments, the second sidewall 28 can have a slope angle ($\beta$) of no greater than about 100 degrees, no greater than about 98 degrees, no greater than about 96 degrees, no greater than about 94 degrees, no greater than about 92 degrees, or even no greater than about 90 degrees. Moreover, the second sidewall 28 can have a slope angle ($\beta$) in a range of any of the minimum and maximum values provided above, such as in a range of about 45 degrees to about 100 degrees. In very particular embodiments, the second sidewall 28 can have a slope angle ($\beta$) in a range of from 55 degrees to about 90 degrees.

In certain embodiments, the first sidewall angle ($\alpha$) can have a particular relationship to the second sidewall angle ($\beta$) to provide enhanced seasonal control effects. In particular embodiments, the second sidewall angle ($\beta$) can be greater than the first sidewall angle ($\alpha$). For example, the second sidewall angle ($\beta$) can be at least 5 degrees greater, at least 10 degrees greater, at least 15 degrees greater, or even at least 20 degrees greater than the first sidewall angle ($\alpha$).

In certain embodiments, the first sidewall can have a length $F_{SL}$ that is greater than the length of the second sidewall $S_{SL}$, both identified in FIG. 3. For example, a ratio of length of the first sidewall to the length of the second sidewall can be calculated according to the following formula:

$$\frac{F}{S} = \frac{\cos(\alpha)}{\cos(\beta)}.$$

In particular embodiments, the ratio of the length of the first sidewall to the length of the second sidewall at least about 0.2, at least about 0.5, at least about 0.8, at least about 1, at least about 1.1, at least about 1.2, at least about 1.3, at least about 1.4, or even at least about 1.5. In further embodiments, a ratio of length of the first sidewall to the length of the second sidewall can be no greater than about 10, no greater than about 8, no greater than about 6, no greater than about 4, no greater than about 3, or even no greater than about 2. Moreover, a ratio of length of the first sidewall to the length of the second sidewall can be in a range of any of the minimum and maximum values provided above, such as in a range of 1.1 to 6, or even 1.2 to 3.

Although illustrated as sharp peaks and valleys in FIGS. 1-5, it is to be understood that the peaks and valley may be rounded or chamfered.

Figure 4:
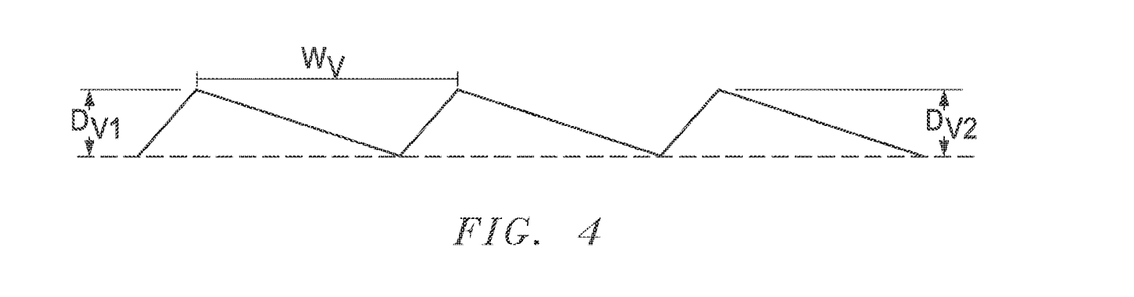
FIG. 4 includes an illustration of a repeating cross-sectional pattern forming a textured surface on a textured substrate without a solar control layer on the textured surface, according to an embodiment of the present disclosure.

FIG. 4 includes an illustration of a repeating pattern of peaks 22 and valleys 24 of the textured substrate. The valleys 24 have depths that are measured as an average vertical distance from the lowest point in the valley to the average between the adjacent peaks, identified in FIG. 4 as $D_V$. For example, the valley depth $D_V$ can be no greater than 50 microns, no greater than 30 microns, no greater than 10 microns, or even no greater than 5 microns. In particular embodiments, the valley depth $D_V$ can be at least 1 micron, at least 2 microns, or at least 3 microns.

Further, as identified in FIG. 4, the valleys can have a particular width $W_V$, measured as the average distance between adjacent valleys. In particular embodiments, the average width of the valleys can be no greater than 90 microns, no greater than 70 microns, or no greater than 50 microns, or no greater than 30 microns. In further embodiments, a $W_V$ of less than 5 microns can exhibit undesirable diffraction effects. For example, the width of the valleys can be at least 1 micron, at least 2 microns, at least 3 microns, at least 5 microns, at least 7 microns, at least 9 microns, or at least 11 microns. The widths can be in a range of any of the maximum and minimum values described above, such as, from 1 micron to 90 microns, 2 microns to 70 microns, at least 3 microns to 50 microns, or 5 microns to 30 microns.

Embodiments of the textured substrate can be formed by many different ways, which may, in part, depend on the material of the textured substrate, the pattern of the textured substrate, or the particular application. In an embodiment, the textured substrate can include a polymer and be formed using a mold or a die. In a particular embodiment, the textured substrate may be formed by coating a polymer layer over a support substrate and embossing the first major surface of the textured substrate with a mold while the polymer layer is cured. The curing can be performed with radiation, such as ultraviolet radiation, or with heat (i.e., thermal curing). In another embodiment, a mold can be placed over the support substrate, and the textured substrate can be injection molded over the support substrate. In a further embodiment, a layer of the polymer may be formed and transfer molded into the textured substrate 20 when over the support substrate or separate from the support substrate.

In another embodiment, the textured substrate may be extruded by itself or coextruded with the support substrate to form the partly completed workpiece. In this embodiment, a die can have a shape corresponding to the shape of the textured substrate, and the spaced-apart (not interconnected) valleys can extend in a direction in which the textured substrate was extruded.

Other techniques may used to form the textured substrate that includes a polymer or another material, such as an inorganic material. In an embodiment, an initial substrate has a surface that is generally planar, and a portion of the initial substrate is removed to form the textured substrate. The removal may be performed using a laser or ion beam or may be performed using a mask-and-etch technique. In another embodiment, the textured substrate may be formed using an additive (that is, adding material) rather than a subtractive (that is, removing material) process. In an embodiment, the initial substrate can have a transparent material selective formed over the initial substrate to form the textured substrate. Such a process would form the peaks over the initial substrate to form the texture substrate. In a particular embodiment, a stencil mask can be placed over the surface of the initial substrate, and the transparent material can be deposited through openings in the stencil mask such that a shape of the transparent material corresponds to a shape of the openings in forming the peaks. Other formation techniques may be used without departing from the scope of particular embodiments.

A solar control layer 40 can be discontinuously disposed over the textured substrate 20 as illustrated in FIG. 1. In particular embodiments, the solar control layer can be disposed along the first sidewall 26. As illustrated in FIG. 1, the solar control layer does not lie along substantially all of the second sidewall 28, and therefore, in the embodiment as illustrated in FIG. 1, portions of the second sidewalk 28 are exposed between the covered portions on the first sidewalk 26.

The number of layers, compositions, and thicknesses of the layers within the solar control layer are selected to allow substantial transmission of visible light while attenuating a significant amount of near IR radiation. The layers within the solar control layer can include silver-based layers, metal-based layers (other than silver-based layers), metal oxide layers, metal nitride layers and may further include barrier layers. Any of the one or more silver-based layers described above can contain silver, and in particular embodiments can consist essentially of silver. As used herein, the phrase "consist essentially of silver" refers to a silver based layer containing at least 95 atomic % silver. In other embodiments, the one or more silver-based layer can have no greater than 30 atomic %, no greater than 20 atomic %, or even no greater than 10 atomic % of another metal, such as, gold, platinum, palladium, copper, aluminum, indium, zinc, or any combination thereof. Any of the one or more metal-based layers described herein can consist essentially of a metal. As used herein, the phrase "consisting essentially of a metal" refers to at least 95 atomic % of a metal.

Any of the one or more silver-based layers can have a thickness of at least 0.1 nm, at least 0.5 nm, or even at least 1 nm. Furthermore, any of the one or more silver-based layers may have a thickness of no greater than about 100 nm, no greater than 50 nm, no greater than 25 nm, or even no greater than 20 nm. Moreover, any of the one or more silver-based layers can have a thickness in a range of any of the maximum and minimum values described above, such as from 0.5 nm to about 25 nm, or even from 1 nm to 20 nm.

In an embodiment, any of the one or more metal based layers described herein can contain an essentially pure metal or in other embodiments, a metal alloy. In other embodiments, any of the one or more metal based layers can contain a metal alloy, such as for example containing a predominant metal in a concentration of at least 70 atomic %, and a minor metal in a concentration of less than 30 atomic % based on the total weight of the metal based layer. Any of the one more metal based layers described herein can contain a metal including gold, titanium, aluminum, platinum, palladium, copper, indium, zinc or combinations thereof. In a particular embodiment, any one of the one more metal based layers described herein can contain gold. In other particular embodiments, the metal based layer(s) can be essentially free of gold. As used herein, the phrase "essentially free of gold" refers to a metal based layer containing less than 5 atomic % gold.

Any of the one or more metal-based layers described above can have a thickness that allows the metal-based layers to be substantially transparent and provide sufficient protection to the silver-based layer. In a particular embodiment, any of the one or more metal-based layers described above can have a thickness of at least 0.1 nm, at least 0.5 nm, or even at least 1 nm. Further, any of the one or more metal-based layers described above may have a thickness of no greater than 100 nm, no greater than 55 nm, no greater than 5 nm, or even no greater than about 2 nm.

Any of the one or more metal-based layers described above can have the same thicknesses or can have a different thickness. In a particular embodiment, each of the one or more metal-based layers have the substantially the same thickness. As used herein, "substantially the same thickness" refers to a thicknesses that are within 10% of each other. The metal oxide based layer can be disposed adjacent to, or even, directly contacting a major surface of a metal based layer opposite the silver based layer.

Any of the one or more metal oxide layer(s) discussed above can contain a metal oxide such as a titanium oxide, an aluminum oxide, $BiO_2$, PbO, NbO, SnZnO, $SnO_2$, $SiO_2$, ZnO, or any combination thereof. In a particular embodiment, a metal oxide layer can contain and even be substantially composed of a titanium oxide or an aluminum oxide. The metal oxide layer(s) have a thickness of at least about 0.5 nm, at least 1 nm, or at least 2 nm, and in another embodiment, may have a thickness of no greater than 100 nm, no greater than 50 nm, no greater than 20 nm, or even no greater than 10 nm. Moreover, any of the one or more metal oxide layer(s) discussed above can have a thickness in a range of any of the maximum and minimum values described above, such as, from 0.5 nm to 100 nm, or even from 2 nm to 50 nm.

The solar control layer can be formed using a technique that forms the solar control layer more readily along the first sidewall while leaving the second sidewall essentially free of a solar control layer. Accordingly, the solar control layer can be non-conformally deposited over the textured substrate 20. In an embodiment, the non-conformal deposition is performed under vacuum using a physical vapor deposition or chemical vapor deposition technique. In a particular embodiment, the non-conformal deposition is performed using sputtering, ion beam deposition, plating, or plasma-enhanced chemical vapor deposition In a particular embodiment, the solar control layer can be formed by DC magnetron, pulsed DC, dual pulsed DC, or dual pulsed AC sputtering using rotatable or planar targets made of metal or ceramic metal oxide. If needed or desired, a collimator or another similar device can be used when sputtering to help prevent or reduce deposition of the solar control layer along the first sidewall.

By nature, sputtering is directional. Accordingly, in particular embodiments, to preferentially deposit an inorganic based solar control layer on the second sidewall, the cathode can be set at a desired angle in relation to the planar surface of the textured substrate. For example, the cathode can be set at an angle that is substantially similar to the angle α of the first sidewall. Thus, the angled directional deposition of the solar control layer can preferentially coat the first sidewall while minimizing deposition on the second sidewall since the first sidewall effectively shields the second sidewall from a direct line of sight will the cathode during deposition. It is to be understood that the greater the angle α of the first sidewall is, the more preferentially the deposition can be. Ideally, an angle α of about 90 degrees can allow the least amount of deposition through a directional deposition technique such as sputtering, on the first sidewall. Further, it is to be understood that a minimal amount of solar control material may be incidentally disposed on the first sidewall. However, as long as the solar performance along the second sidewall is reduced compared to the solar performance of the first sidewall, an improved seasonal selectivity can still be obtained.

In other embodiments, the solar control layer can be preferentially deposited on the first sidewall through use of a mask. The mask can substantially cover the second sidewall and thereby prevent deposition on the second sidewall while allowing deposition on the first sidewall. In such embodiments, the range of techniques and materials that may be used to form and deposit the solar control layer can be broadened. For example, use of a mask can allow for a wet coated solar control layer, such as a solar control layer containing a plurality of infrared reflective or absorptive particles dispersed with a polymer matrix.

In particular embodiments, the solar control layer can be discontinuously formed on a substantially planar substrate and then the composite can be textured as described above. For example, the substrate can be masked and then a solar control layer applied to achieve a desired pattern. The composite of the substrate and the discontinuous solar control layer can be textured, such as through embossing, such that the solar control layer is disposed on the first sidewall.

Referring again to FIG. 1, the solar control composite 10 can further include a planarization layer 60 disposed adjacent the textured substrate 20 and the solar control layer 40 where present. The planarization layer 60 can have a first major surface 62 having a complementary profile to the combined textured substrate and solar control layer to provide intimate contact therebetween. The opposing second major surface 64 of the planarization layer can be substantially flat or planar.

The average thickness of the planarization layer 60 over the peaks can be at least 1 micron, at least 1.1 microns, at least 1.3 microns, or at least 1.5 microns, and in another embodiment, the thickness is no greater than 10 microns, no greater than 9.8 microns, or no greater than 9.6 microns. The thickness can be in a range of any of the maximum and minimum values described above, such as, from 1.1 microns to 10 microns, or 1.5 microns to 9.6 microns.

In a particular embodiment, haze can be further reduced when the refractive indices of the textured substrate 20 and the planarization layer 60 are the same. For example, in particular embodiments, the planarization layer 60 can have a refractive index within about 0.1, within about 0.05, or even within about 0.03 units of the refractive index of the textured substrate.

In particular embodiments, the planarization layer 60 can have a refractive index of at least about 1.4, at least about 1.5, at least about 1.6, or even at least about 1.65. In further embodiments, the planarization layer 60 can have a refractive index of no greater than about 2.0, no greater than about 1.9, no greater than about 1.8, or even no greater than about 1.75. Moreover, the planarization layer 60 can have a refractive index in a range of any of the minimums and maximums provided above, such as in a range of from about 1.4 to about 2.0, about 1.5 to about 1.8, or even about 1.65 to about 1.75.

The planarization layer 60 may include any of the materials as previously described with respect to the textured substrate 20. In an embodiment, the planarization layer 60 includes an adhesive, such as a laminating adhesive or a pressure sensitive adhesive. In an embodiment, the planarization layer 60 can include polyester, acrylate, polyvinyl acetate ("PVAc"), polyvinyl butyral, polyvinyl alcohol ("PVA"), silicone rubber, another suitable adhesive, or any mixture thereof.

The selection of the materials for the textured substrate 20 and planarization layer 60 may be performed to achieve particular properties. For example, haze may be a concern, and to reduce haze, the refractive indices of the materials for the textured substrate 20 and trench-fill material can be within 0.03 of each other, within 0.02 of each other, or within 0.01 of each other. A refractive index is determined at 20° C. with a radiation source that emits light at 589 nm (yellow light). When the refractive indices are different, the refractive index of the material of the textured substrate 20 may be higher than the trench-fill material, or vice versa. In a particular embodiment, the textured substrate 20 can include an acrylate that has a refractive index of about 1.49, and the trench-fill material can include PVAc that has a refractive index of about 1.47. In another particular embodiment, the textured substrate 20 can include glass ($SiO_2$) that has a refractive index of about 1.54, and the trench-fill material can include PVA that has a refractive index of about 1.53. Thus, after reading this specification, skilled artisans will be able to determined matched pairs of materials for the textured substrate 20 and trench-fill material to achieve relatively low haze.

In certain embodiments, the planarization layer can be formed by any suitable technique. For example, when the planarization layer is an adhesive, the adhesive can be coated onto the textured substrate or the second substrate through any type of coating process, such as spray coating, dip coating, knife coating, or any other suitable coating method. In other embodiments, the planarization layer can be formed according to any of the techniques described above with relation to the textured substrate and contain an essentially complementary texture to the combined textured substrate and discontinuous solar control layer. Further, it is to be understood that the planarization layer can be formed first, the solar control layer deposited on the planarization and then the textured substrate formed atop the combined planarization layer and the solar control layer.

Figure 5:
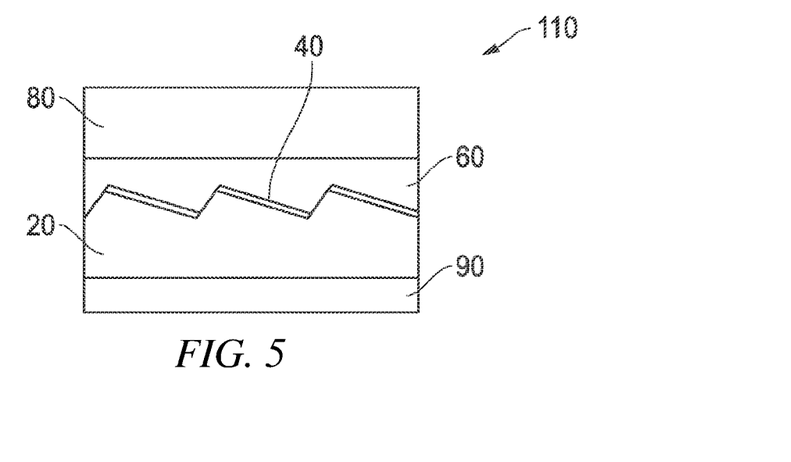
FIG. 5 is an illustration of a cross-section of a composite according to another embodiment of the present disclosure.

As illustrated in FIG. 1 and FIG. 5, the transparent composite 10 can further include a second substrate 80 over the planarization layer 60. The second substrate 80 can serve to protect the solar control layer 40. The second substrate 80 can have a high transmission of visible light and can be relatively resistant to yellowing or cracking over long term exposure to the sun. The second substrate 80 can include any of the materials as described below with respect to the support substrate 90. In particular embodiments, the second substrate 80 can have a thickness in a range of 10 microns to 50 microns. In further embodiments, the second substrate 80 can have a thickness of up to 2 mm, up to 4 mm, or even up to 6 mm.

When the planarization layer 60 is a laminating adhesive or a pressure sensitive adhesive, the second substrate 80 can be applied directly to the planarization layer 60. When the planarization layer 60 is not an adhesive, an adhesive such as a pressure sensitive adhesive, can be used to adhere the second substrate 80 to the planarization layer 60.

A substantially completed transparent composite can include a transparent film designed to be applied to a window (not illustrated). A hard coat layer can lie along the support substrate on a surface opposite the textured substrate. The hard coat layer can provide improvement in abrasion resistance, so that the support layer is less likely to be scratched. The hard coat layer can include a cross-linked acrylate, an acrylate containing nanoparticles, such as $SiO_2$ or $Al_2O_3$, or any combination thereof. The hard coat layer can have a thickness in a range of 1 micron to 5 microns.

Optionally, an adhesive layer can be disposed between the second substrate and a release layer. The adhesive layer can include any of the adhesive materials and thicknesses as previously described with respect to the planarization layer when the planarization layer is an adhesive. In another embodiment, the adhesive layer can include any adhesive that is clear and has at least 85% transparency to visible light for the particular thickness of the adhesive layer. In one embodiment, the adhesive layer is a pressure sensitive adhesive. In some cases, once installed on a window, the adhesive layer is the first layer within the transparent composite to be crossed by the sunlight. In such case, a UV resistant layer can be used as the adhesive layer such as an acrylate. An additive, such as a UV absorber, can be added in order to increase durability of the whole transparent composite. The release liner protects the adhesive layer during shipping and handling of the transparent composite. The release liner will be removed before the transparent composite is applied to a window. Thus, the transmissive properties of the release liner are not important; the release liner can be opaque to visible light or can be translucent. Therefore, the composition and thickness of the release layer is not critical. In a particular embodiment where the transparent composite is stored as a roll, the thickness of the release liner is selected, to allow the transparent composite to be flexible. In another embodiment, the release liner is not used. For example, the transparent composite may be installed onto a window shortly after the transparent composite is fabricated. After the adhesive layer is applied, the transparent composite is installed onto a window.

In certain embodiments, the composite can also reduce the amount of ultraviolet light that is transmitted through the composite. Reduction of ultraviolet light can be beneficial to increase the service life of the composite, and to reduce exposure to potentially harmful ultraviolet rays by people. Accordingly, any of the layers described herein, such as the textured substrate layer, the second substrate, the planarization, and/or the support substrate can have a desirable UV absorption or reflection. In particular embodiments, the textured substrate layer, the second substrate, the planarization, and/or the support substrate can include a plurality of ultraviolet light absorbing particles dispersed within the transparent polymer to provide reduction in UV transmission.

FIG. 5 includes an illustration of another composite 110 according to certain embodiments of the present disclosure. As illustrated in FIG. 5, the solar control composite 110 can include a support substrate 90 adjacent the textured substrate 20. A support substrate 90 can be used in conjunction with a very thin textured substrate 20 to enable the composite to be self-supporting.

In certain embodiments, the textured substrate 20 may be self-supporting at a thickness of at least 25 microns or at least 50 microns, and therefore a support substrate, such as support substrate 90, may not be needed. However, a support substrate can be used at any thickness. In particular embodiments, the textured substrate 20 can include a support substrate, such as when the textured substrate 20 has a thickness of no greater than 25 microns or no greater than 50 microns, and a support substrate 90 can be used as illustrated in FIG. 5. The presence, thickness and composition of the support substrate 90 can be determined based on the desired application.

When the transparent composite produced is a film to be applied to a window, the support substrate 90 may be flexible. In other embodiments, the support substrate can be a substantially rigid material, such as glass or a polycarbonate.

In certain embodiments, the support substrate 90 can have a thickness of at least 11 microns, at least 17 microns, or at least 25 microns, and in another embodiment, the thickness of the support substrate 90 may be no greater than 900 microns, no greater than 600 microns, or no greater than 300 microns. The support substrate 90 can have a thickness in a range of any of the maximum and minimum values described above, such as, from 11 microns to 900 microns, 17 microns to 600 microns, or 25 microns to 300 microns, in further embodiments, the support substrate 90 can have a thickness of up to 2 mm, up to 4 mm, or even up to 6 mm.

The support substrate 90 can include any of the material previously described with respect to the textured substrate 20. In an embodiment, the support substrate 90 has a different composition than the textured substrate 20. For example, the support substrate 90 can include PET.

In certain embodiments, the support substrate 90 can have a refractive index of at least about 1.4, at least about 1.5, at least about 1.6, or even at least about 1.65. In further embodiments, the support substrate 90 can have a refractive index of no greater than about 2.0, no greater than about 1.9, no greater than about 1.8, or even no greater than about 1.75. Moreover, the support substrate 90 can have a refractive index in a range of any of the minimums and maximums provided above, such as in a range of from about 1.4 to about 2.0, about 1.5 to about 1.8, or even about 1.65 to about 1.75.

In a different embodiment, a transparent composite can be fabricated on or using a window. In a particular embodiment, the support substrate 90 or the textured substrate can be replaced by the window. The window can include a glass, a sapphire, spinel, AlON, a polymer such as polycarbonate, or any composite of the foregoing, such as transparent armor. The textured substrate 20 can be formed on or applied to the surface of the window. The solar control layer can be formed as previously described.

In another different embodiment, the window may be the textured substrate 20. In this embodiment, a surface of the window may be covered by a masking layer, and portions of the window can be etched or otherwise removed to form a surface having peaks and valleys as previously described with respect to the textured substrate 20. After removing the mask, fabrication of the solar control layer, clear weatherable layer, and hard coat layer are substantially the same as described in the prior embodiment. In a further embodiment, the window can be textured by using a stencil mask and selectively depositing a transparent material onto the window to achieve a textured substrate.

The solar control composite according to certain embodiments of the present disclosure can have a desirable energetic transmission at various different incidence angles. As discussed throughout this document, a unique attribute of the solar control composites according to certain embodiments of the present disclosure is the ability to achieve a more advantageous energetic transmission that dynamically adapts to the changing weather seasons. As the seasons change, the angle of the sunlight (i.e., the incidence angles) change. Thus, the solar control composites according to certain embodiments of the present disclosure can alter their energetic transmission at different incidences angles. As used herein, the phrase "energetic transmission (TE)" is a measure of direct solar transmittance. The energetic transmission (TE) can be determined as is well understood in the art according to ISO 9050:2003, except that solar direct transmittance is defined following this formula:

$$\tau_e = \frac{\sum_{\lambda=300nm}^{2500nm} \tau(\lambda) S_\lambda \Delta\lambda}{\sum_{\lambda=300nm}^{2500nm} S_\lambda \Delta\lambda}$$

where $S_\lambda$ is the relative spectral distribution of the solar radiation and $\tau(\lambda)$ is the spectral transmittance of the glazing. The ISO standard adds the note: "Contrary to real situations, it is always assumed, for simplification, that the solar radiation strikes the glazing as a beam and almost at normal incidence. In the case of oblique incidence of radiation, the solar direct transmittance of glazing and the total solar energy transmittance are both somewhat reduced. The solar control effect becomes greater in the case of oblique incidence of radiation." However, for the purposes of this disclosure, $\tau(\lambda,\theta)$ is used to consider solar radiation striking the glazing at real incidence.

Accordingly, in particular embodiments, the solar control composite can have an energetic transmission (TE) of at least 45%, at least 50%, at least 55%, at least 60%, or even at least about 65% as measured at a 0 degree incidence angle. In further embodiments, the solar control composite can have an energetic transmission (TE) of at least 45%, at least 50%, at least 55%, at least 60%, or even at least about 61% as measured at a 10 degree incidence angle. Moreover, in certain embodiments, the solar control composite can have an energetic transmission (TE) of at least 45%, at least 50%, at least 55%, or even at least 60% as measured at a 20 degree incidence angle. In still further embodiments, the solar control composite can have an energetic transmission (TE) of at least 45%, at least 50%, at least 55%, at least 60%, or even at least about 65% as measured at a 30 degree incidence angle. In yet still further embodiments, the solar control composite can have an energetic transmission (TE) of at least 45%, at least 48%, or even at least 50% as measured at a 40 degree incidence angle. Moreover, in particular embodiments, the solar control composite can have an energetic transmission (TE) of at least 35% as measured at a 50 degree incidence angle.

It is to be understood that the solar control composite can have any combination of the above recited energetic transmission values at the recited incidence angles. In fact, in particular embodiments, the solar control composite can have the above recited energetic transmission values across all of the recited incidence angles.

The degree of change of the energetic transmission at different incidence angles relevant to the movement of the sun can be quantified by the metric "Seasonal Selectivity (SE)". As used herein, the metric "seasonal selectivity" can be calculated according to the following equation:

$$\frac{[TE(30°) + TE(35°) + TE(40°)] - [TE(60°) + TE(65°) + TE(70°)]}{[TE(30°) + TE(35°) + TE(40°)]}$$

wherein TE represents the energetic transmission described above, and wherein $\Theta$ represents the incidence angle.

Accordingly, in particular embodiments, the solar control composite can have a seasonal selectivity (Se) of at least about 0.2, at least about 0.22, at least about 0.24, at least about 0.26, at least about 0.28, at least about 0.3, at least about 0.32, at least about 0.34, at least about 0.36, at least about 0.38, at least about 0.4, at least about 0.42, at least about 0.44, or even at least about 0.46. In further embodiments, the seasonal selectivity can be no greater than about 0.64, no greater than about 0.62, or no greater than about 0.6. Moreover, the seasonal selectivity can be in a range of any of the minimum and maximum values provided above, such as in a range of 0.22 to 0.64, 0.24 to 0.62, or 0.26 to 0.6.

In particular embodiments, the solar control composite can be used in high demanding visual transmission applications, such as windshields. Accordingly, is will be illustrated in more detail in the examples below, the solar control composite can be fabricated to achieve a high level of visible light transmission. The visible light transmission, or VLT, is a well known parameter in the field of transparent solar control materials. A particular advantage of certain embodiments of the present disclosure is the ability to have a high visible light transmission across a wide spectrum of incidence angles, particularly in addition to the seasonal selectivity discussed above.

Accordingly, in particular embodiments, the solar control composite can have a visible light transmission (VLT) of at least about 45%, at least about 50%, at least about 55%, at least about 60%, at least about 65%, or even at least about 70% as measured at a 0 degree incidence angle, 10 degree incidence angle, 20 degree incidence angle, 30 degree incidence angle, 40 degree incidence angle, 50 degree incidence angle, or even at all the preceding incidence angles.

Another parameter to describe exemplary features in certain embodiments of the solar control composite of the present disclosure is the difference between the visible light transmission (VLT) and energetic transmission (TE) at different incidence angles.

Accordingly, in particular embodiments, the solar control composite can have a difference between the light transmission and the energetic transmission of no greater than about 25%, no greater than about 20%, no greater than about 15%, no greater than about 12%, or even no greater than about 10% as measured at a 0 degree incidence angle. In further embodiments, the solar control composite can have a difference between the light transmission and the energetic transmission of no greater than about 25%, no greater than about 20%, no greater than about 15%, no greater than about 12%, or even no greater than about 10% as measured at a 10 degree incidence angle. In still further embodiments, the solar control composite can have a difference between the light transmission and the energetic transmission of no greater than about 25%, no greater than about 20%, no greater than about 15%, no greater than about 12%, or even no greater than about 10% as measured at a 20 degree incidence angle. In yet further embodiments, the solar control composite can have a difference between the light transmission and the energetic transmission of no greater than about 25%, no greater than about 20%, no greater than about 15%, no greater than about 12%, or even no greater than about 10% as measured at a 30 degree incidence angle. In still yet further embodiments, the solar control composite can have a difference between the light transmission and the energetic transmission of no greater than about 25%, no greater than about 20%, or even no greater than about 18% as measured at a 40 degree incidence angle. In yet further embodiments, the solar control composite can have a difference between the light transmission and the energetic transmission of no greater than about 30%, or even no greater than about 27% as measured at a 40 degree incidence angle.

Yet another parameter to describe the characteristics of the solar control composite according to embodiments of the present disclosure is a low haze, particularly given the presence of a textured coating. Without wishing to be bound by theory, the refractive index matching of the textured substrate and the planarization layer along with a matching structural interface leads to the ability to obtain a low haze. As used herein, haze is a well known parameter in the transparent solar control arts, and can be measured according to ASTM D1003-11.

Accordingly, in particular embodiments, the solar control composite can have a haze of no greater than 10%, no greater than 8%, no greater than 5%, or even no greater than 3%.

EXAMPLES

Sample 1 and Comparative Sample 2 were prepared and tested for their performance as a solar control film. The basic construction for Sample 1 was a bi-silver layer coating on a textured substrate, as described herein, comprising PET and having an (α) of 30° and a (β) of 85°. The basic construction for Comparative Sample 2 was a bi-silver layer coating on a flat substrate of the same material as the textured substrate of Sample 1.

The Energetic Transmission (TE) and the Visible Light Transmission (TL) were tested at different angles of incidence (°) for Sample 1 and Comparative Sample 2. The results were plotted on the graph illustrated in FIG. 6, where the top solid line represents TL-Seasonal, the top dashed line represents TL-Flat, the bottom solid line represents TE-Seasonal, and the bottom dashed line represents TE-Flat.

Figure 6:
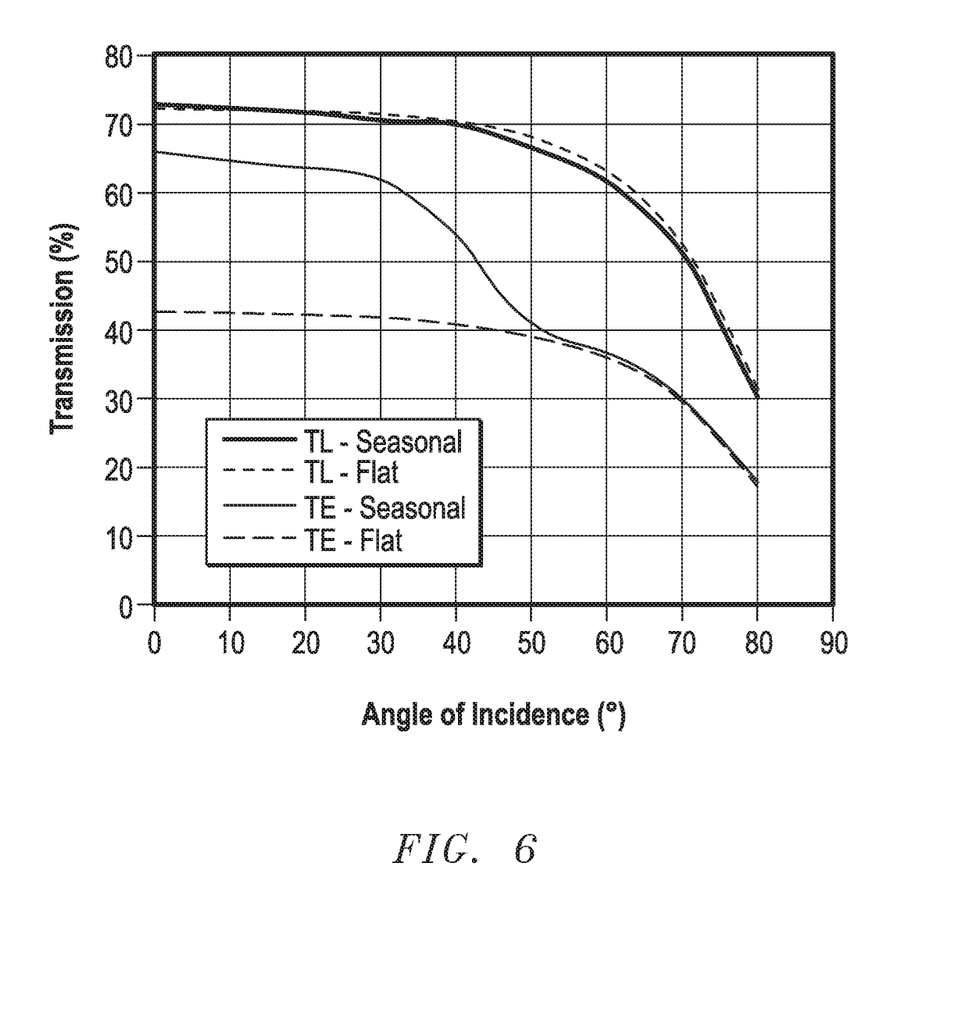
FIG. 6 includes a graph plotting energetic transmission, visible light transmission, and angle of incidence for Sample 1 and Comparative Sample 2.

As illustrated in FIG. 6, both Sample 1 and Comparative Sample 2 exhibit similar visible light transmission (TL) properties. However, Sample 1 exhibits much greater performance in the total Energetic Transmission (TE) at low angles and similar performance at high angles. Thus, Comparative Sample 2 has a seasonal selectivity of 0.21, whereas Sample 1 has a much improved seasonal selectivity (Se) of 0.43.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the items as listed below.

Embodiment 1

A solar control composite comprising:
a. a substrate having a textured surface;
b. a solar control layer discontinuously disposed adjacent a portion of textured substrate surface; and
c. a planarization layer disposed adjacent the solar control layer, thereby sandwiching the discontinuous solar control layer between the substrate and the planarization layer.

Embodiment 2

The solar control composite of embodiment 1, wherein the solar control composite has a Seasonal Selectivity (Se) of at least about 0.22, wherein seasonal selectivity is determined according to Formula I:

$$\frac{[TE(30°) + TE(35°) + TE(40°)] - [TE(60°) + TE(65°) + TE(70°)]}{[TE(30°) + TE(35°) + TE(40°)]}; \quad (I)$$

wherein TE represents energetic transmission, and wherein Θ represents the incidence angle.

Embodiment 3

A solar control composite comprising:
a. a substrate;
b. a solar control layer disposed adjacent the substrate; and
c. wherein the solar control composite has a Seasonal Selectivity Se of at least about 0.22, wherein seasonal selectivity is determined according to Formula I:

$$\frac{[TE(30°) + TE(35°) + TE(40°)] - [TE(60°) + TE(65°) + TE(70°)]}{[TE(30°) + TE(35°) + TE(40°)]}; \quad (I)$$

wherein TE represents energetic transmission, i.e. the transmission spectrum integrated over the solar spectrum, and wherein Θ represents the incidence angle.

Embodiment 4

A solar control composite comprising:
a. a substrate having a patterned textured surface, wherein the pattern comprises a valley, a peak, a first sidewall and a second sidewall which meet at the peak;
b. a solar control layer disposed adjacent the first sidewall, wherein the solar control layer is discontinuous; and
c. a planarization layer disposed adjacent the solar control layer, thereby sandwiching the solar control layer between the substrate and the planarization layer.

Embodiment 5

A seasonal solar control composite film comprising:
a. a substrate having a textured surface;

b. a discontinuous solar control layer; and
c. a planarization layer;
d. wherein the seasonal solar control composite is adapted to provide a varying solar control in response to changes in incidence angles from the sun;
e. wherein the seasonal solar control composite film is adapted to be disposed adjacent a substantially transparent substrate.

Embodiment 6

A method of forming a seasonal solar control composite, the method comprising:
a. providing a textured substrate;
b. discontinuously disposing a solar control layer adjacent the textured substrate;
c. applying a planarization layer to the substrate.

Embodiment 7

A method of forming a seasonal solar control composite, the method comprising:
a. providing a substrate having a first generally planar surface and a second surface;
b. forming a textured surface on the second surface of the substrate, wherein the textured surface comprises a repeating pattern of peaks and valleys connected to each other by a first sidewall and a second sidewall;
c. preferentially depositing a solar control layer on the first sidewall;
d. applying a planarization layer to the substrate thereby forming a composite having generally planar outer surfaces.

Embodiment 8

A method of forming a seasonal solar control composite, the method comprising:
a. providing a substrate;
b. disposing a solar control adjacent the substrate,
c. wherein the solar control composite has a Seasonal Selectivity Se of at least about 0.31, wherein seasonal selectivity is determined according to Formula I:

$$\frac{[TE(30°) + TE(35°) + TE(40°)] - [TE(60°) + TE(65°) + TE(70°)]}{[TE(30°) + TE(35°) + TE(40°)]}; \quad (I)$$

wherein TE represents energetic transmission, and wherein Θ represents the incidence angle.

Embodiment 9

The solar control composite of any one of the preceding embodiments, wherein the substrate comprises a rigid transparent panel.

Embodiment 10

The solar control composite of any one of the preceding embodiments, wherein the substrate comprises a rigid transparent glass panel.

Embodiment 11

The solar control composite of any one of the preceding embodiments, wherein the substrate comprises a flexible substrate.

Embodiment 12

The solar control composite of any one of the preceding embodiments, wherein the substrate comprises a film.

Embodiment 13

The solar control composite of any one of the preceding embodiments, wherein the substrate comprises a thermoplastic film.

Embodiment 14

The solar control composite of any one of the preceding embodiments, wherein the substrate comprises a thermoplastic film comprising a substantially transparent polymer.

Embodiment 15

The solar control composite of any one of the preceding embodiments, wherein the substrate comprises a thermoplastic film comprising a substantially transparent polymer comprising a polyacrylate, a polyester, a polycarbonate, a polysiloxane, a polyether, a polyvinyl compound, or combinations thereof.

Embodiment 16

The solar control composite of any one of the preceding embodiments, wherein the substrate comprises a film, and the composite is adapted to adhere to a transparent panel.

Embodiment 17

The solar control composite of any one of the preceding embodiments, wherein the substrate comprises a film, and the composite further comprises a transparent panel.

Embodiment 18

The solar control composite of any one of the preceding embodiments, wherein the textured surface comprises a predetermined texture pattern.

Embodiment 19

The solar control composite of any one of the preceding embodiments, wherein the patterned textured surface comprises a repeating pattern including a valley, a peak, and a first sidewall and a second sidewall which meet at the peak, as viewed in cross section.

Embodiment 20

The solar control composite of any one of the preceding embodiments, wherein the first sidewall extends at an angle of α, and wherein the second sidewall extends at an angle of β.

Embodiment 21

The solar control composite of any one of the preceding embodiments, wherein α is at least about 20 degrees, at least 22 degree, at least 24 degrees, at least 26 degrees, at least 28 degrees, or even 30 degrees.

Embodiment 22

The solar control composite of any one of the preceding embodiments, wherein α is no greater than about 45 degrees, no greater than about 43 degrees, no greater than about 41 degrees, no greater than about 39 degrees, no greater than about 37 degrees, or even no greater than about 35 degrees.

Embodiment 23

The solar control composite of any one of the preceding embodiments, wherein α is in a range of 20 degrees to about 45 degrees, or even from about 30 degrees to about 35 degrees.

Embodiment 24

The solar control composite of any one of the preceding embodiments, wherein β is at least about 45 degrees, at least about 47 degrees, at least about 49 degrees, at least about 51 degrees, at least about 53 degrees, or even at least about 55 degrees.

Embodiment 25

The solar control composite of any one of the preceding embodiments, wherein β is no greater than about 100 degrees, no greater than about 98 degrees, no greater than about 96 degrees, no greater than about 94 degrees, no greater than about 92 degrees, or even no greater than about 90 degrees.

Embodiment 26

The solar control composite of any one of the preceding embodiments, wherein β is in a range of about 45 degrees to about 100 degrees, or about 55 degrees to about 90 degrees.

Embodiment 27

The solar control composite of any one of the preceding embodiments, wherein β is greater than α.

Embodiment 28

The solar control composite of any one of the preceding embodiments, wherein β is at least 5 degrees, at least 10 degrees, at least 15 degrees, or even at least 20 degrees greater than α.

Embodiment 29

The solar control composite of any one of the preceding embodiments, wherein the first sidewall is longer than the second sidewall.

Embodiment 30

The solar control composite of any one of the preceding embodiments, wherein the substrate has a refractive index of at least about 1.4, at least about 1.5, at least about 1.6, or even at least about 1.65.

Embodiment 31

The solar control composite of any one of the preceding embodiments, wherein the substrate has a refractive index of no greater than about 2.0, no greater than about 1.9, no greater than about 1.8, or even no greater than about 1.75.

Embodiment 32

The solar control composite of any one of the preceding embodiments, wherein the substrate has a refractive index in a range of any of the minimums and maximums provided above, such as in a range of from about 1.4 to about 2.0, about 1.5 to about 1.8, or even about 1.65 to about 1.75.

Embodiment 33

The solar control composite of any one of the preceding embodiments, wherein the substrate has a valley depth $D_V$ of no greater than 50 microns, no greater than 30 microns, no greater than 10 microns, or no greater than 5 microns.

Embodiment 34

The solar control composite of any one of the preceding embodiments, wherein the substrate has a valley depth $D_V$ of at least 1 micron, at least 2 microns, or at least 3 microns.

Embodiment 35

The solar control composite of any one of the preceding embodiments, wherein the substrate has a valley width $W_V$ of no greater than 90 microns, no greater than 70 microns, no greater than 50 microns, or no greater than 30 microns.

Embodiment 36

The solar control composite of any one of the preceding embodiments, wherein the substrate has a valley width $W_V$ of at least 1 micron, at least 2 microns, at least 3 microns, at least 5 microns, at least 7 microns, at least 9 microns, or at least 11 microns.

Embodiment 37

The solar control composite of any one of the preceding embodiments, wherein the substrate has a valley width $W_V$ in a range of 1 micron to 90 microns, 2 microns to 70 microns, at least 3 microns to 50 microns, or 5 microns to 30 microns.

Embodiment 38

The solar control composite of any one of the preceding embodiments, wherein the first sidewall can have a length that is greater than the length of the second sidewall.

Embodiment 39

The solar control composite of any one of the preceding embodiments, wherein a ratio of length of the first sidewall to the length of the second sidewall is at least about 0.2, at least about 0.5, at least about 0.8, at least about 1, at least about 1.1, at least about 1.2, at least about 1.3, at least about 1.4, or even at least about 1.5.

Embodiment 40

The solar control composite of any one of the preceding embodiments, wherein a ratio of length of the first sidewall to the length of the second sidewall is no greater than about 10, no greater than about 8, no greater than about 6, no greater than about 4, no greater than about 3, or even no greater than about 2.

Embodiment 41

The solar control composite of any one of the preceding embodiments, wherein a ratio of length of the first sidewall to the length of the second sidewall is in a range of from 1.1 to 6, or even 1.2 to 3.

Embodiment 42

The solar control composite of any one of the preceding embodiments, wherein the solar control layer comprises a solar control coating.

Embodiment 43

The solar control composite of any one of the preceding embodiments, wherein the solar control layer comprises a film.

Embodiment 44

The solar control composite of any one of the preceding embodiments, wherein the solar control layer comprises a multi-layer film.

Embodiment 45

The solar control composite of any one of the preceding embodiments, wherein the solar control layer comprises a solar control film and a solar control coating.

Embodiment 46

The solar control composite of any one of the preceding embodiments, wherein the solar control layer is discontinuously disposed on the textured substrate surface.

Embodiment 47

The solar control composite of any one of the preceding embodiments, wherein the solar control layer is disposed on one of the first sidewall or the second sidewall.

Embodiment 48

The solar control composite of any one of the preceding embodiments, wherein the solar control layer is disposed on the first sidewall.

Embodiment 49

The solar control composite of any one of the preceding embodiments, wherein the solar control layer comprises a polymeric matrix and dispersed IR reflecting nanoparticles.

Embodiment 50

The solar control composite of any one of the preceding embodiments, wherein the solar control layer comprises at least one of silver-based layers, metal-based layers (other than silver-based layers), metal oxide layers, metal nitride layers, and barrier layers.

Embodiment 51

The solar control composite of any one of the preceding embodiments, wherein the solar control layer comprises at least one silver-based layer.

Embodiment 52

The solar control composite of any one of the preceding embodiments, wherein the solar control layer comprises at least one silver-based layer consisting essentially of silver.

Embodiment 53

The solar control composite of any one of the preceding embodiments, wherein the solar control layer comprises at least one silver-based layer having no greater than 30 atomic %, no greater than 20 atomic %, or even no greater than 10 atomic % of another metal.

Embodiment 54

The solar control composite of any one of the preceding embodiments, wherein the solar control layer comprises at least one metal-based layer comprising essentially pure metal or a metal alloy.

Embodiment 55

The solar control composite of any one of the preceding embodiments, wherein the solar control layer comprises at least one metal-based layer comprising a predominant metal other than silver in a concentration of at least 70 atomic %, and a minor metal in a concentration of less than 30 atomic % based on the total weight of the metal based layer.

Embodiment 56

The solar control composite of any one of the preceding embodiments, wherein the solar control layer comprises at least one metal-based layer comprising a gold, a titanium, an aluminum, a platinum, a palladium, a copper, an indium, a zinc or combinations thereof.

Embodiment 57

The solar control composite of any one of the preceding embodiments, wherein the solar control layer comprises at least one metal-based layer essentially free of gold.

Embodiment 58

The solar control composite of any one of the preceding embodiments, wherein the solar control layer comprises at least one metal oxide layer.

Embodiment 59

The solar control composite of any one of the preceding embodiments, wherein the solar control layer comprises at least one metal oxide layer comprising a titanium oxide, an aluminum oxide, a $BiO_2$, a PbO, an NbO, an SnZnO, an $SnO_2$, an $SiO_2$, a ZnO, or any combination thereof.

Embodiment 60

The solar control composite of any one of the preceding embodiments, wherein the solar control layer is substantially composed of a titanium oxide or an aluminum oxide.

Embodiment 61

The solar control composite of any one of the preceding embodiments, wherein the planarization layer has a first major surface and a second major surface opposite the first major surface, and wherein the first major surface has a generally complementary texture pattern to the substrate surface texture pattern.

Embodiment 62

The solar control composite of any one of the preceding embodiments, wherein the planarization layer has a first major surface and a second major surface opposite the first major surface, and wherein the first major surface has a generally complementary texture pattern to the substrate surface texture pattern, and wherein the second major surface is substantially flat.

Embodiment 63

The solar control composite of any one of the preceding embodiments, wherein the planarization layer comprises an optical adhesive.

Embodiment 64

The solar control composite of any one of the preceding embodiments, wherein the planarization layer has an average thickness over the peaks of the textured substrate of at least 0.2 micron, at least 0.5 micron, at least 0.8 micron or at least 1.1 microns.

Embodiment 65

The solar control composite of any one of the preceding embodiments, wherein the planarization layer has an average thickness over the peaks of the textured substrate of no greater than 7 microns, no greater than 5 microns, no greater than 4 microns, or no greater than 3 microns.

Embodiment 66

The solar control composite of any one of the preceding embodiments, wherein the planarization layer has an average thickness over the peaks of the textured substrate in a range of 0.2 micron to 7 microns, 0.5 micron to 5 microns, 0.8 micron to 4 microns, or 1.1 microns to 3 microns.

Embodiment 67

The solar control composite of any one of the preceding embodiments, wherein the planarization layer has a refractive index of at least about 1.4, at least about 1.5, at least about 1.6, or even at least about 1.65.

Embodiment 68

The solar control composite of any one of the preceding embodiments, wherein the planarization layer has a refractive index of no greater than about 2.0, no greater than about 1.9, no greater than about 1.8, or even no greater than about 1.75.

Embodiment 69

The solar control composite of any one of the preceding embodiments, wherein the planarization layer has a refractive index in a range of from about 1.4 to about 2.0, about 1.5 to about 1.8, or even about 1.65 to about 1.75.

Embodiment 70

The solar control composite of any one of the preceding embodiments, wherein the planarization layer comprises an adhesive, such as a laminating adhesive or a pressure sensitive adhesive.

Embodiment 71

The solar control composite of any one of the preceding embodiments, wherein the planarization layer comprises a polyester, an acrylate, a polyvinyl acetate ("PVAc"), a polyvinyl butyral, a polyvinyl alcohol ("PVA"), a silicone rubber, or any mixture thereof.

Embodiment 72

The solar control composite of any one of the preceding embodiments, wherein the substrate has a refractive index $RI_S$ and the planarization layer has a refractive index $RI_P$, and wherein the difference between the refractive index of the substrate and the refractive index of the planarization layer is no greater than 10%, no greater than 5%, no greater than 3%, no greater than 2%, no greater than 1%, or even no greater than about 0.5%, wherein the difference between the refractive index is determined according to Formula II:

Difference in RI between the Substrate and the Planarization layer=$((RI_S-RI_P)/RI_S)*(100\%)$. (II)

Embodiment 73

The solar control composite of any one of the preceding embodiments, wherein the solar control composite has a seasonal selectivity (Se) of at least about 0.2, at least about 0.22, at least about 0.24, at least about 0.26, at least about 0.28, at least about 0.3, at least about 0.32, at least about 0.34, at least about 0.36, at least about 0.38, at least about 0.4, at least about 0.42, at least about 0.44, or even at least about 0.46, wherein seasonal selectivity is determined according to Formula I:

$$\frac{[TE(30°) + TE(35°) + TE(40°)] - [TE(60°) + TE(65°) + TE(70°)]}{[TE(30°) + TE(35°) + TE(40°)]}, \quad (I)$$

wherein TE represents energetic transmission, i.e. the transmission spectrum integrated over the solar spectrum, and wherein Θ represents the incidence angle.

Embodiment 74

The solar control composite of embodiment 73, wherein the solar control composite has a seasonal selectivity (Se) of no greater than about 0.64, no greater than about 0.62, or no greater than about 0.6.

Embodiment 75

The solar control composite of embodiment 73 or embodiment 74, wherein the solar control composite has a seasonal selectivity (Se) in a range of 0.22 to 0.64, 0.24 to 0.62, or 0.26 to 0.6.

Embodiment 76

The solar control composite of any one of the preceding embodiments, wherein the solar control composite has an energetic transmission (TE) of at least 45%, at least 50%, at least 55%, at least 60%, or even at least about 65% as measured at a 0 degree incidence angle.

Embodiment 77

The solar control composite of any one of the preceding embodiments, wherein the solar control composite has an energetic transmission (TE) of at least 45%, at least 50%, at least 55%, at least 60%, or even at least about 61% as measured at a 10 degree incidence angle.

Embodiment 78

The solar control composite of any one of the preceding embodiments, wherein the solar control composite has an energetic transmission (TE) of at least 45%, at least 50%, at least 55%, or even at least 60% as measured at a 20 degree incidence angle.

Embodiment 79

The solar control composite of any one of the preceding embodiments, wherein the solar control composite has an energetic transmission (TE) of at least 45%, at least 50%, at least 55%, at least 60%, or even at least about 65% as measured at a 30 degree incidence angle.

Embodiment 80

The solar control composite of any one of the preceding embodiments, wherein the solar control composite has an energetic transmission (TE) of at least 45%, at least 48%, or even at least 50% as measured at a 40 degree incidence angle.

Embodiment 81

The solar control composite of any one of the preceding embodiments, wherein the solar control composite has an energetic transmission (TE) of at least 35% as measured at a 50 degree incidence angle.

Embodiment 82

The solar control composite of any one of the preceding embodiments, wherein the solar control composite has a visible light transmission (VLT) of at least 45%, at least 50%, at least 55%, at least 60%, at least about 65%, or even at least about 70% as measured at a 0 degree incidence angle.

Embodiment 83

The solar control composite of any one of the preceding embodiments, wherein the solar control composite has a visible light transmission (VLT) of at least 45%, at least 50%, at least 55%, at least 60%, at least about 65%, or even at least about 70% as measured at a 10 degree incidence angle.

Embodiment 84

The solar control composite of any one of the preceding embodiments, wherein the solar control composite has a visible light transmission (VLT) of at least 45%, at least 50%, at least 55%, at least 60%, at least about 65%, or even at least about 70% as measured at a 20 degree incidence angle.

Embodiment 85

The solar control composite of any one of the preceding embodiments, wherein the solar control composite has a visible light transmission (VLT) of at least 45%, at least 50%, at least 55%, at least 60%, at least about 65%, or even at least about 70% as measured at a 30 degree incidence angle.

Embodiment 86

The solar control composite of any one of the preceding embodiments, wherein the solar control composite has a visible light transmission (VLT) of at least 45%, at least 50%, at least 55%, at least 60%, at least about 65%, or even at least about 70% as measured at a 40 degree incidence angle.

Embodiment 87

The solar control composite of any one of the preceding embodiments, wherein the solar control composite has a visible light transmission (VLT) of at least 45%, at least 50%, at least 55%, at least 60%, or even at least about 65% as measured at a 50 degree incidence angle.

Embodiment 88

The solar control composite of any one of the preceding embodiments, wherein the solar control composite has a difference between the light transmission and the energetic transmission of no greater than about 25%, no greater than about 20%, no greater than about 15%, no greater than about 12%, or even no greater than about 10% as measured at a 0 degree incidence angle.

Embodiment 89

The solar control composite of any one of the preceding embodiments, wherein the solar control composite has a difference between the light transmission and the energetic transmission of no greater than about 25%, no greater than about 20%, no greater than about 15%, no greater than about 12%, or even no greater than about 10% as measured at a 10 degree incidence angle.

Embodiment 90

The solar control composite of any one of the preceding embodiments, wherein the solar control composite has a difference between the light transmission and the energetic transmission of no greater than about 25%, no greater than about 20%, no greater than about 15%, no greater than about 12%, or even no greater than about 10% as measured at a 20 degree incidence angle.

Embodiment 91

The solar control composite of any one of the preceding embodiments, wherein the solar control composite has a difference between the light transmission and the energetic transmission of no greater than about 25%, no greater than about 20%, no greater than about 15%, no greater than about 12%, or even no greater than about 10% as measured at a 30 degree incidence angle.

Embodiment 92

The solar control composite of any one of the preceding embodiments, wherein the solar control composite has a difference between the light transmission and the energetic transmission of no greater than about 25%, no greater than about 20%, or even no greater than about 18% as measured at a 40 degree incidence angle.

Embodiment 93

The solar control composite of any one of the preceding embodiments, wherein the solar control composite has a difference between the light transmission and the energetic transmission of no greater than about 30%, or even no greater than about 27% as measured at a 40 degree incidence angle.

Embodiment 94

The solar control composite of any one of the preceding embodiments, wherein the solar control composite has a haze of no greater than 10%, no greater than 8%, no greater than 5%, or even no greater than 3%, as measured according to ASTM D1003-11.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features, that are for clarity, described herein in the context of separate embodiments, may also be provided in combination in a single embodiment. Conversely, various features that are, for brevity, described in the context of a single embodiment, may also be provided separately or in a subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A composite comprising:
   a. a substrate;
   b. a solar control layer; and
   c. a planarization layer;
   d. wherein the substrate has a textured surface comprising a repeating pattern including a valley, a peak, a first sidewall extending at a first angle, and a second sidewall extending at a second angle and meeting the first sidewall at the peak,
   e. wherein the solar control layer is deposited on the first sidewall,
   f. wherein the solar control layer is discontinuous, and
   g. wherein the planarization layer is adjacent the solar control layer and the substrate.

2. The composite of claim 1, wherein the substrate comprises polyester.

3. The composite of claim 1, wherein the first angle is in a range of 20 degrees to 45 degrees.

4. The composite of claim 1, wherein the second angle is in a range of 45 degrees to 100 degrees.

5. The composite of claim 1, wherein the first sidewall is longer than the second sidewall.

6. The composite of claim 1, wherein the substrate has a valley depth $D_V$ of no greater than 50 microns.

7. The composite of claim 1, wherein the substrate has a valley width $W_V$ of no greater than 90 microns.

8. The composite of claim 1, wherein a ratio of length of the first sidewall to the length of the second sidewall is at least 0.2.

9. The composite of claim 1, wherein the solar control layer comprises at least one silver-based layer.

10. The composite of claim 1, wherein the solar control layer comprises at least one metal oxide layer.

11. The composite of claim 1, wherein the planarization layer has an average thickness over the peaks of the textured substrate of no greater than 7 microns.

12. The composite of claim 1, wherein the planarization layer has a refractive index of at least 1.4.

13. The composite of claim 1, wherein the substrate has a refractive index and the planarization layer has a refractive index, and wherein the difference between the refractive index of the substrate and the refractive index of the planarization layer is no greater than 10%.

14. The composite of claim 1, wherein the composite has a seasonal selectivity (Se) of at least 0.24, wherein seasonal selectivity is determined according to the formula:

$$\frac{[TE(30°) + TE(35°) + TE(40°)] - [TE(60°) + TE(65°) + TE(70°)]}{[TE(30°) + TE(35°) + TE(40°)]},$$

wherein TE(Θ) represents energetic transmission, i.e. the transmission spectrum integrated over the solar spectrum, at solar incidence angle Θ.

15. A method of forming a seasonal solar control composite, the method comprising:
   a. providing a substrate having a first generally planar surface and a second surface;

b. forming a textured surface on the second surface of the substrate, wherein the textured surface comprises a repeating pattern of peaks and valleys connected to each other by a first sidewall and a second sidewall;

c. preferentially depositing a solar control layer on the first sidewall;

d. applying a planarization layer to the substrate thereby forming a composite having generally planar outer surfaces.

16. The method of claim 15, wherein the substrate comprises polyester.

17. The method of claim 15, wherein the solar control layer comprises at least one silver-based layer.

18. The method of claim 15, wherein the solar control layer comprises at least one metal oxide layer.

19. The method of claim 15, wherein the planarization layer has a refractive index of at least 1.4.

20. The method of claim 15, wherein the substrate has a refractive index and the planarization layer has a refractive index, and wherein the difference between the refractive index of the substrate and the refractive index of the planarization layer is no greater than 10%.

\* \* \* \* \*